(12) United States Patent
Takami

(10) Patent No.: US 7,052,522 B2
(45) Date of Patent: May 30, 2006

(54) POLISHING COMPOSITION AND POLISHING METHOD USING THE SAME

(75) Inventor: Shinichiro Takami, Aichi (JP)

(73) Assignee: Fujimi Incorporated, Aichi (JP)

( * ) Notice: Subject to any disclaimer, the term of this patent is extended or adjusted under 35 U.S.C. 154(b) by 0 days.

(21) Appl. No.: 10/673,767

(22) Filed: Sep. 29, 2003

(65) Prior Publication Data

US 2004/0127046 A1 Jul. 1, 2004

(30) Foreign Application Priority Data

Sep. 30, 2002 (JP) .............................. 2002-287447

(51) Int. Cl.
C09G 1/02 (2006.01)
C09G 1/04 (2006.01)
B24B 1/00 (2006.01)

(52) U.S. Cl. ................. 51/308; 106/3; 106/5; 438/692; 438/693

(58) Field of Classification Search ................. 51/308; 106/3, 5; 438/692, 693
See application file for complete search history.

(56) References Cited

U.S. PATENT DOCUMENTS

| | | | | |
|---|---|---|---|---|
| 3,715,842 A | * | 2/1973 | Tredinnick et al. ........... | 451/36 |
| 5,352,277 A | * | 10/1994 | Sasaki ........................... | 106/6 |
| 6,280,652 B1 | | 8/2001 | Inoue et al. ................ | 252/79.1 |
| 6,312,487 B1 | | 11/2001 | Tanaka ......................... | 51/309 |
| 6,454,820 B1 | * | 9/2002 | Hagihara et al. ............. | 51/308 |
| 2001/0003672 A1 | * | 6/2001 | Inoue et al. ................ | 438/690 |
| 2002/0028636 A1 | * | 3/2002 | Koichi et al. ................ | 451/41 |
| 2002/0095872 A1 | * | 7/2002 | Tsuchiya et al. .............. | 51/307 |
| 2002/0194789 A1 | * | 12/2002 | Oshima ....................... | 51/308 |
| 2003/0061766 A1 | * | 4/2003 | Vogt et al. .................... | 51/308 |

FOREIGN PATENT DOCUMENTS

| | | |
|---|---|---|
| EP | 0 967 260 A1 | 12/1999 |
| EP | 1 350 827 A1 | 10/2003 |
| EP | 1 403 351 A1 | 3/2004 |
| EP | 1 424 727 A1 | 6/2004 |
| JP | 11-349925 | 12/1999 |
| JP | 2000-158329 | 6/2000 |
| WO | WO 98/48453 | 10/1998 |
| WO | WO 02/48279 A1 | 6/2002 |
| WO | WO 03/068882 A1 | 8/2003 |

* cited by examiner

Primary Examiner—Michael A. Marcheschi
(74) Attorney, Agent, or Firm—Vidas, Arrett&Steinkraus, PA

(57) ABSTRACT

A polishing composition of the present invention, which is used in polishing the edge of a wafer for semiconductor devices, effectively suppresses remaining amounts of abrasives on the wafer. The polishing composition includes silicon dioxide, an alkaline compound, a water-soluble polymer, and water. The average primary particle diameter $D_{SA}$ of the silicon dioxide is at least 40 nm. The ratio $D_{95}/D_5$ of the silicon dioxide is no more than 3.8. The value $D_{95}/D_5/D_{SA}$ of the silicon dioxide is no more than 0.07.

20 Claims, No Drawings

POLISHING COMPOSITION AND POLISHING METHOD USING THE SAME

BACKGROUND OF THE INVENTION

The present invention relates to a polishing composition used in polishing the edge of a wafer for semiconductor devices and a polishing method using the same.

The edge of a wafer cut out from an ingot is generally beveled in a beveling process, then polished in an edge polishing process. This series of processes on the edge of the wafer is mainly intended to suppress occurrence of chipping on the edge of the wafer and to suppress formation of edge crown in epitaxial growth on the wafer.

The polishing composition used in the edge polishing process generally contains abrasives, such as silicon dioxide. The polishing composition splashes onto the surface of a wafer in edge polishing, and abrasives contained in the splashed polishing composition remain on the wafer in the form of dry gel. The remaining abrasives cause scratches on the surface of the wafer.

Japanese Laid-Open Patent Publication No. 11-349925 and Japanese Laid-Open Patent Publication No. 2000-158329 disclose an improved polishing composition for the edge polishing process. The improved polishing composition contains a water-soluble polymer, and the water-soluble polymer improves the wettability of the surface of a wafer to suppress remaining of abrasives in the form of dry gel on the wafer. However, even if the improved polishing composition is used, the amount of remaining abrasives on the wafer is not sufficiently reduced.

SUMMARY OF THE INVENTION

Accordingly, it is an objective of the present invention to provide a polishing composition capable of effectively suppressing remaining amounts of abrasives on a wafer, and a polishing method using the same.

To achieve the above objective, the present invention provides a polishing composition used in polishing a wafer edge. The polishing composition includes silicon dioxide, an alkaline compound, a water-soluble polymer, and water. The average primary particle diameter $D_{SA}$ of the silicon dioxide is at least 40 nm. The ratio $D_{95}/D_5$ of the silicon dioxide is no more than 3.8.

The present invention provides another polishing composition used in polishing a wafer edge. The polishing composition includes silicon dioxide, an alkaline compound, a water-soluble polymer, and water. The average primary particle diameter $D_{SA}$ of the silicon dioxide is at least 40 nm. The value $D_{95}/D_5/D_{SA}$ of the silicon dioxide is no more than 0.07.

The present invention also provides a method of polishing a wafer. The method includes preparing a polishing composition and polishing the edge of the wafer using the polishing composition. The polishing composition includes silicon dioxide, an alkaline compound, a water-soluble polymer, and water. The average primary particle diameter $D_{SA}$ of the silicon dioxide is at least 40 nm. The ratio $D_{95}/D_5$ of the silicon dioxide is no more than 3.8.

The present invention provides another method of polishing a wafer. The method includes preparing a polishing composition and polishing the edge of the wafer using the polishing composition. The polishing composition includes silicon dioxide, an alkaline compound, a water-soluble polymer, and water. The average primary particle diameter $D_{SA}$ of the silicon dioxide is at least 40 nm. The value $D_{95}/D_5/D_{SA}$ of the silicon dioxide is no more than 0.07.

The present invention provides yet another method of polishing a wafer. The method includes preparing a polishing composition and polishing the edge of the wafer using the polishing composition. The polishing composition includes silicon dioxide, an alkaline compound, a water-soluble polymer, and water. The average primary particle diameter $D_{SA}$ of the silicon dioxide is at least 40 nm. The ratio $D_{95}/D_5$ of the silicon dioxide is no more than 3.8. The value $D_{95}/D_5/D_{SA}$ of the silicon dioxide is no more than 0.07.

Other aspects and advantages of the invention will become-apparent from the following description, illustrating by way of example the principles of the invention.

DETAILED DESCRIPTION OF THE PREFERRED EMBODIMENTS

A first embodiment of the present invention will be described below.

A polishing composition according to the first embodiment consists of silicon dioxide, an alkaline compound, a water-soluble polymer, and water.

The above-mentioned silicon dioxide mechanically polishes an object to be polished.

The average primary particle diameter $D_{SA}$ of the silicon dioxide obtained from the specific surface area of the silicon dioxide measured by the BET method is at least 40 nm, preferably at least 60 nm, more preferably at least 70 nm. The measurement of the specific surface area of the silicon dioxide measured by the BET method is carried out in accordance with JIS Z8830 "Determination of the specific surface area of powders (solids) by gas adsorption method."

The ratio $D_{95}/D_5$ obtained by dividing the 95th percentile diameter $D_{95}$ of the silicon dioxide, in terms of volume, by the 5th percentile diameter $D_5$ of the silicon dioxide, in terms of volume, is no more than 3.8, preferably no more than 3.6, more preferably no more than 3.4.

The 95th percentile diameter $D_{95}$ and the 5th percentile diameter $D_5$ can be measured by Capillary Hydrodynamic Fractionation type particle size measuring apparatus such as "CHDF2000" manufactured by Matec Applied Sciences.

The silicon dioxide is preferably colloidal silica, fumed silica, or precipitated silica, more preferably colloidal silica. The polishing composition may contain only one kind of silicon dioxide, or two or more kinds of silicon dioxides.

The content of the silicon dioxide in the polishing composition is preferably from 0.1 to 50 wt %, more preferably from 1 to 50 wt %, further preferably from 10 to 50 wt %.

The above-mentioned alkaline compound chemically polishes an object to be polished.

Specific examples of the alkaline compound include inorganic alkaline compounds such as potassium hydroxide, sodium hydroxide, potassium hydrogencarbonate, potassium carbonate, sodium hydrogencarbonate, and sodium carbonate; ammonia; ammonium salts such as tetramethylammonium hydroxide, ammonium hydrogencarbonate, and ammonium carbonate; amines such as methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl)piperazine, and N-methylpiperazine. A preferred alkaline compound is potassium hydroxide, sodium hydroxide, potassium hydrogencarbonate, potassium carbonate, sodium hydrogencarbonate, sodium carbonate, ammonia, tetramethylammonium hydroxide, ammonium hydrogencarbonate, ammonium carbonate, anhydrous piperazine, piperazine hexahydrate, 1-(2-aminoethyl)piperazine, or N-methylpiperazine; and a particularly preferred alkaline compound is potassium hydroxide, sodium hydroxide, potassium hydrogencarbonate, potassium carbonate, sodium hydrogencarbonate, sodium carbonate, tetramethylammonium hydroxide, ammonium hydrogencarbonate, ammonium carbonate, anhydrous piperazine, or piperazine hexahydrate. The polishing composition may contain only one kind of alkaline compound, or two or more kinds of alkaline compounds.

When the alkaline compound is a compound other than either of piperazine or piperazine derivatives, the content of the alkaline compound in the polishing composition is preferably from 0.1 to 6 wt %, more preferably from 0.5 to 5 wt %, particularly preferably from 1 to 4 wt %. When the alkaline compound is anhydrous piperazine, 1-(2-aminoethyl)piperazine, or N-methylpiperazine, the content is preferably from 0.1 to 10 wt %, more preferably from 1 to 9 wt %, and particularly preferably 3 to 8 wt %. When the alkaline compound is piperazine hexahydrate, the content is preferably from 0.1 to 20 wt %, more preferably from 2 to 18 wt %, and particularly preferably from 5 to 16 wt %.

The above-mentioned water-soluble polymer is preferably hydroxyethyl cellulose, polyvinyl alcohol, polyethylene oxide, or polyethylene glycol, and more preferably hydroxyethyl cellulose. The polishing composition may contain only one kind of water-soluble polymer, or two or more kinds of water-soluble polymers.

The average molecular weight of hydroxyethyl cellulose is preferably from 300,000 to 3,000,000; more preferably from 600,000 to 2,000,000; and particularly preferably from 900,000 to 1,500,000. The average molecular weight of polyvinyl alcohol is preferably from 1,000 to 1,000,000; more preferably from 5,000 to 500,000; and particularly preferably from 10,000 to 300,000. The average molecular weight of polyethylene oxide is preferably from 20,000 to 50,000,000; more preferably from 20,000 to 30,000,000; and particularly preferably from 20,000 to 10,000,000. The average molecular weight of polyethylene glycol is preferably from 100 to 20,000; more preferably from 300 to 20,000; and particularly preferably from 1,000 to 20,000.

The content of the water-soluble polymer in the polishing composition is preferably from 0.0001 to 0.5 wt %, more preferably from 0.001 to 0.3 wt %, and particularly preferably from 0.005 to 0.15 wt %.

The above-mentioned water serves as a medium of dispersing or dissolving components other than water, contained in the polishing composition. It is preferred that water should contain as few impurities as possible. Preferable water is ion exchanged water filtrated through a filter or distilled water.

Next, a method will be described of producing a wafer for semiconductor devices, including a process of polishing a wafer edge by the above-mentioned polishing composition.

The process of producing a polished wafer from an ingot includes a slicing process, beveling process, wrapping process, etching process, edge polishing process, and polishing process. In the slicing process, a wafer is cut from an ingot. In the subsequent beveling process, the edge of the wafer is beveled. In the subsequent wrapping process, the surface of the wafer is coarsely-polished. In the subsequent etching process, a process-modified layer generated on the surface of the wafer in prior processes to the etching process is removed. In the subsequent edge polishing process, the beveled edge of the wafer is polished. In the subsequent polishing process, the surface of the wafer is precisely polished.

The above-mentioned polishing composition is used in the edge polishing process of this series of processes. In the edge polishing process, the edge of the wafer is polished by bringing the edge of the wafer (etched wafer) into contact with a polishing member and by allowing relative sliding of the edge of the wafer and polishing member while feeding a polishing composition to this contact portion.

As the polishing machine for the edge polishing process, there may be mentioned those in which a wafer edge and a polishing member are approximately in point contact during polishing (for example, EP-150/200/300-IV NF manufactured by Speedfam), and those in which a wafer edge and a polishing member are approximately in linear contact during polishing (for example, EP-300X manufactured by Speedfam). The above-mentioned polishing composition may be used in any of point contact type and linear contact type polishing machines, and it is preferably used in linear polishing type polishing machines.

The first embodiment of the present invention provides the following advantages.

When the edge of the wafer is polished by the polishing composition according to the first embodiment, abrasives (silicon dioxide) contained in the polishing composition are easily removed from the surface by washing even if they adhere to the surface of the wafer. Therefore, the amount of abrasives remaining on the wafer in the form of dry gel is decreased significantly, and consequently, scratch caused by the remaining abrasives is decreased. The main reasons for easy removal of adhered abrasives from the surface of the wafer by washing include the following two reasons. The first reason is that the polishing composition contains a water-soluble polymer improving the wettability of the surface of the wafer, and the second reason is that the polishing composition contains no silicon dioxide of small size in a large amount. Silicon dioxide of small size cannot be easily removed when adhered to the surface of a wafer since it has high surface activity. Therefore, in order to decrease the amount of remaining abrasives, it is important to decrease the amount of silicon dioxide of small size contained in the polishing composition as small as possible. Silicon dioxide contained in the polishing composition according to the first embodiment satisfies both the average primary particle diameter $D_{SA}$ of at least 40 nm and the ratio $D_{95}/D_5$ of no more than 3.8. Namely, the polishing composition according to the first embodiment contains, as an abrasive, silicon dioxide having relatively large particle size and having relatively uniform particle size, and contains no large amount of silicon dioxide of small size.

The amount of remaining abrasives is particularly decreased when the water-soluble polymer contained in the polishing composition is at least one polymer selected from hydroxyethyl cellulose, polyvinyl alcohol, polyethylene oxide, and polyethylene glycol. The above-mentioned effect is improved when the water-soluble polymer contained in the polishing composition is hydroxyethyl cellulose. The reason for this is presumed that when any of the above-mentioned water-soluble polymers, particularly hydroxyethyl cellulose is intervened between abrasives and a wafer, the adhesive force of abrasives to the wafer decreases.

The effect of decreasing the amount of remaining abrasives is surely demonstrated when the content of the water-soluble polymer in the polishing composition is at least 0.0001 wt %. The above-mentioned effect is improved when the content of the water-soluble polymer is at least 0.001 wt %, and the above-mentioned effect is further improved when it is at least 0.005 wt %.

Increase in viscosity of the polishing composition caused by excess content is prevented when the content of the water-soluble polymer in the polishing composition is no more than 0.5 wt %. The above-mentioned effect is improved when the content of the water-soluble polymer is no more than 0.3 wt %, and the above-mentioned effect is further improved when it is no more than 0.15 wt %.

Increase in haze on the surface of the wafer caused by very small average molecular weight of the water-soluble polymer is prevented when the water-soluble polymer contained in the polishing composition is hydroxyethyl cellulose having an average molecular weight of at least 300,000; when the water-soluble polymer contained in the polishing composition is polyvinyl alcohol having an average molecular weight of at least 1,000; when the water-soluble polymer contained in the polishing composition is polyethylene oxide having an average molecular weight of at least 20,000; and when the water-soluble polymer contained in the polishing composition is polyethylene glycol having an average molecular weight of at least 100. The above-mentioned effect is improved when the water-soluble polymer contained in the polishing composition is hydroxyethyl cellulose having an average molecular weight of at least 600,000; when the water-soluble polymer contained in the polishing composition is polyvinyl alcohol having an average molecular weight of at least 5,000; and when the water-soluble polymer contained in the polishing composition is polyethylene glycol having an average molecular weight of at least 300. The above-mentioned effect is further improved when the water-soluble polymer contained in the polishing composition is hydroxyethyl cellulose having an average molecular weight of at least 900,000; when the water-soluble polymer contained in the polishing composition is polyvinyl alcohol having an average molecular weight of at least 10,000; and when the water-soluble polymer contained in the polishing composition is polyethylene glycol having an average molecular weight of at least 1,000.

Increase in viscosity of the polishing composition caused by excessiveness of average molecular weight of the water-soluble polymer is prevented when the water-soluble polymer contained in the polishing composition is hydroxyethyl cellulose having an average molecular weight of no more than 3,000,000; when the water-soluble polymer contained in the polishing composition is polyvinyl alcohol having an average molecular weight of no more than 1,000,000; when the water-soluble polymer contained in the polishing composition is polyethylene oxide having an average molecular weight of no more than 50,000,000; and when the water-soluble polymer contained in the polishing composition is polyethylene glycol having an average molecular weight of no more than 200,000. The above-mentioned effect is improved when the water-soluble polymer contained in the polishing composition is hydroxyethyl cellulose having an average molecular weight of no more than 2,000,000; when the water-soluble polymer contained in the polishing composition is polyvinyl alcohol having an average molecular weight of no more than 500,000; and when the water-soluble polymer contained in the polishing composition is polyethylene oxide having an average molecular weight of no more than 30,000,000. The above-mentioned effect is further improved when the water-soluble polymer contained in the polishing composition is hydroxyethyl cellulose having an average molecular weight of no more than 1,500,000; when the water-soluble polymer contained in the polishing composition is polyvinyl alcohol having an average molecular weight of no more than 300,000; and when the water-soluble polymer contained in the polishing composition is polyethylene oxide having an average molecular weight of no more than 10,000,000.

Occurrence of scratches on the surface of the wafer is suppressed when the silicon dioxide contained in the polishing composition is at least one type of silica selected from colloidal silica, fumed silica, and precipitated silica. The above-mentioned effect is improved when the silicon dioxide contained in the polishing composition is colloidal silica.

Occurrence of the scratches on the surface of the wafer caused by excessiveness of average primary particle diameter $D_{SA}$ of the silicon dioxide is prevented when the silicon dioxide contained in the polishing composition is colloidal silica having an average primary particle diameter $D_{SA}$ of no more than 1000 nm; when the silicon dioxide contained in the polishing composition is fumed silica having an average primary particle diameter $D_{SA}$ of no more than 300 nm; and when the silicon dioxide contained in the polishing composition is precipitated silica having an average primary particle diameter $D_{SA}$ of no more than 3000 nm. The above-mentioned effect is improved when the silicon dioxide contained in the polishing composition is colloidal silica having an average primary particle diameter $D_{SA}$ of no more than 800 nm; and when the silicon dioxide contained in the polishing composition is precipitated silica having an average primary particle diameter $D_{SA}$ of no more than 2500 nm. The above-mentioned effect is further improved when the silicon dioxide contained in the polishing composition is colloidal silica having an average primary particle diameter $D_{SA}$ of no more than 500 nm; and when the silicon dioxide contained in the polishing composition is precipitated silica having an average primary particle diameter $D_{SA}$ of no more than 2000 nm.

Extreme decrease in polishing speed caused by too small content is prevented when the content of the silicon dioxide in the polishing composition is at least 0.1 wt %. The above-mentioned effects are improved when the content of the silicon dioxide is at least 1 wt %, and the above-mentioned effects are further improved when the content is at least 10 wt %.

Increase in viscosity of the polishing composition caused by excess content is prevented when the content of the silicon dioxide in the polishing composition is no more than 50 wt %.

Extreme decrease in polishing speed caused by too small content is prevented when the alkaline compound contained in the polishing composition is at least 0.1 wt %. The above-mentioned effect is improved when the alkaline compound contained in the polishing composition is a compound other than either of piperazine or piperazine derivatives and the content of the alkaline compound in the polishing composition is at least 0.5 wt %; when the alkaline compound contained in the polishing composition is anhydrous piperazine, 1-(2-aminoethyl)piperazine, or N-methylpiperazine and the content of the alkaline compound in the polishing composition is at least 1 wt %; and when the alkaline compound contained in the polishing composition is piperazine hexahydrate and the content of the alkaline compound in the polishing composition is at least 2 wt %. The above-mentioned effect is improved when the alkaline compound contained in the polishing composition is a compound other than either of piperazine or piperazine derivatives and the content of the alkaline compound in the polishing composition is at least 1 wt %; when the alkaline compound contained in the polishing composition is anhydrous piperazine, 1-(2-aminoethyl)piperazine, or N-methylpiperazine and the content of the alkaline compound in the polishing composition is at least 3 wt %; and when the alkaline compound contained in the polishing composition is piperazine hexahydrate and the content of the alkaline compound in the polishing composition is at least 5 wt %.

Gelation, cost elevation of the polishing composition, and the surface roughening of the wafer caused by excess content is prevented when the alkaline compound contained in the polishing composition is a compound other than either of piperazine or piperazine derivatives and the content of the alkaline compound in the polishing composition is no more than 6 wt %; when the alkaline compound contained in the polishing composition is anhydrous piperazine, 1-(2-aminoethyl)piperazine, or N-methylpiperazine and the content of the alkaline compound in the polishing composition is no more than 10 wt %; and when the alkaline compound contained in the polishing composition is piperazine hexahydrate and the content of the alkaline compound in the polishing composition is no more than 20 wt %. The above-mentioned effect is improved when the alkaline compound contained in the polishing composition is a compound other than either of piperazine or piperazine derivatives and the content of the alkaline compound in the polishing composition is no more than 5 wt %; when the alkaline compound contained in the polishing composition is anhydrous piperazine, 1-(2-aminoethyl)piperazine, or N-methylpiperazine and the content of the alkaline compound in the polishing composition is no more than 9 wt %; and when the alkaline compound contained in the polishing composition is piperazine hexahydrate and the content of the alkaline compound in the polishing composition is no more than 18 wt %. The above-mentioned effect is further improved when the alkaline compound contained in the polishing composition is a compound other than either of piperazine or piperazine derivatives and the content of the alkaline compound in the polishing composition is no more than 4 wt %; when the alkaline compound contained in the polishing composition is anhydrous piperazine, 1-(2-aminoethyl)piperazine, or N-methylpiperazine and the content of the alkaline compound in the polishing composition is no more than 8 wt %; and when the alkaline compound contained in the polishing composition is piperazine hexahydrate and the content of the alkaline compound in the polishing composition is no more than 16 wt %.

In the case of using a polishing machine of linear contact type, the temperature of a wafer is higher as compared with the case of using a polishing machine of point contact type. Thus, abrasives tend to remain in the form of dry gel on the wafer. Therefore, when the polishing composition of the first embodiment is used in a polishing machine of linear contact type, the effect of decreasing the amount of remaining abrasives is remarkably demonstrated.

A second embodiment of the present invention will be described mainly by referring to matters different from those of the first embodiment.

A polishing composition according to the second embodiment consists of silicon dioxide, an alkaline compound, a water-soluble polymer, and water similarly to the first embodiment. However, the polishing composition of the second embodiment is different from that of the first embodiment with respect to only a part of requirement for the silicon dioxide.

The average primary particle diameter $D_{SA}$ of the silicon dioxide is at least 40 nm, preferably at least 60 nm, more preferably at least 70 nm as in the first embodiment. The ratio $D_{95}/D_5$ of the silicon dioxide is arbitrary. It should be noted that the value $D_{95}/D_5/D_{SA}$ obtained by dividing the ratio $D_{95}/D_5$ by the average primary particle diameter $D_{SA}$ of the silicon dioxide is no more than 0.07, preferably no more than 0.06, more preferably no more than 0.045.

The silicon dioxide contained in the polishing composition according to the second embodiment satisfies both the requirement that the average primary particle diameter $D_{SA}$ be at least 40 nm and that the value $D_{95}/D_5/D_{SA}$ be no more than 0.07. Specifically, the polishing composition according to the second embodiment contains the silicon dioxide having particles of relatively large size and of relatively uniform particle diameters as abrasives. Thus, the polishing composition does not contain as significant amount of silicon dioxide of smaller particle diameters as in the first embodiment. Accordingly, the second embodiment provides similar advantages to those of the first embodiment.

Next, a third embodiment of the present invention will be described mainly by referring to matters different from those of the first embodiment.

A polishing composition according to the third embodiment consists of silicon dioxide, an alkaline compound, a water-soluble polymer, and water similarly to the first embodiment. However, the polishing composition of the third embodiment is different from that of the first embodiment with respect to only a part of requirement for the silicon dioxide.

The average primary particle diameter $D_{SA}$ of the silicon dioxide is at least 40 nm, preferably at least 60 nm, more preferably at least 70 nm as in the first embodiment. The ratio $D_{95}/D_5$ of the silicon dioxide is no more than 3.8, preferably no more than 3.6, more preferably no more than 3.4 as in the first embodiment. The value $D_{95}/D_5/D_{SA}$ obtained by dividing the ratio $D_{95}/D_5$ by the average primary particle diameter $D_{SA}$ of the silicon dioxide is no more than 0.07, preferably no more than 0.06, more preferably no more than 0.045.

The silicon dioxide contained in the polishing composition according to the third embodiment satisfies all the requirements that the average primary particle diameter $D_{SA}$ be at least 40 nm, that the ratio $D_{95}/D_5$ be no more than 3.8, and that the value $D_{95}/D_5/D_{SA}$ be no more than 0.07. Specifically, the polishing composition according to the third embodiment contains the silicon dioxide having particles of relatively large size and of relatively uniform particle diameters as abrasives. Thus, the polishing composition does not contain as significant amounts of silicon dioxide of smaller particle diameters as in the first embodiment. Accordingly, the third embodiment provides similar advantages to those of the first embodiment.

It should be apparent to those skilled in the art that the present invention may be embodied in many other specific forms without departing from the spirit or scope of the invention. Particularly, it should be understood that the invention may be embodied in the following forms.

The polishing compositions according to the embodiments may also contain known additives generally contained in conventional polishing compositions, for example, surfactants, chelating agents, preservatives, and the like.

The polishing composition according to the embodiments may be prepared also by dilution in use with water of stock liquid previously prepared so that other components than water are contained at relatively high concentrations. The dilution magnification is preferably no more than 40 times, more preferably no more than 20 times, particularly preferably no more than 10 times.

Next, the present invention will be further specifically described by examples and comparative examples.

Colloidal silica, alkaline compounds, and water-soluble polymers were mixed in ion exchanged water to prepare polishing compositions of Examples 1 to 35 and Comparative Examples 1 to 20. Details of each of colloidal silica, alkaline compounds, and water-soluble polymers contained in the polishing compositions are shown in Tables 1 and 2.

In the column of "Colloidal silica" in Tables 1 and 2, "A" to "L" represent colloidal silica each having the value shown in Table 3 with respect to $D_{SA}$, $D_{95}/D_5$, and $D_{95}/D_5/D_{SA}$.

In the column of "Alkaline compound" in Tables 1 and 2:
"TMAH" represents 25 wt % aqueous solution of tetramethylammonium hydroxide,
"PHA" represents potassium hydroxide,
"PIZ" represents anhydrous piperazine, and
"PCA" represents potassium carbonate.

In the column of "Water-soluble polymer" in Tables 1 and 2:
"HEC*1" represents hydroxyethyl cellulose having an average molecular weight of 400,000,
"HEC*2" represents hydroxyethyl cellulose having an average molecular weight of 1,200,000,
"HEC*3" represents hydroxyethyl cellulose having an average molecular weight of 1,800,000,
"PVA" represents polyvinyl alcohol having an average molecular weight of 60,000,
"PEG" represents polyethylene glycol having an average molecular weight of 10,000,
"PEO" represents polyethylene oxide having an average molecular weight of 200,000,
"G" represents glycerin,
"EG" represents ethylene glycol, and
"SPA" represents sodium polyacrylate having an average molecular weight of from 10,000 to 20,000.

The edge of the wafer (an object to be polished) was polished by each of the polishing compositions under the following conditions.

Polishing Conditions
Polishing machine: "EP-150/200/300-IV NF" (Speedfam)
Object to be polished: Etched silicon wafer of Φ8' (=200 mm) (P-<100>). In the column of "Object to be polished" in Tables 1 and 2, silicon wafer represented by "Bare" is bare, and silicon wafer represented by "SiO$_2$" is covered with an oxide film having a thickness of 5000 Å.
Contact angle: 45°
Polishing Load: 2 kg
Drum revolution: 800 rpm
Drum lifting speed: 72 mm/min
Wafer revolution: 1 rpm
Polishing tape: DRP-II (Speedfam)
Polishing time: 4 minutes
Feeding speed of polishing composition: 300 ml/min (using circulation)

If abrasives remain in the form of dry gel on a wafer, when the surface of the wafer is illuminated with strong light, it is visually recognized as stains. Therefore, the surface of the wafer scrub-washed with pure water after edge polish was observed visually while illuminating with a halogen spot light (500 klx) in a dark room. That showing entirely no stain on the surface of the wafer was evaluated as ∘∘, that showing scarcely no stain was evaluated as ∘, that showing many stains of pale color was evaluated as ▼, and that showing many stains of dark color was evaluated as x. The results are shown in the column of "Stain" in Tables 1 and 2.

The polishing speed in edge polishing was calculated according to the following calculation formula. That showing a polishing speed of at least 1.5 mg/min was evaluated as ∘∘, that showing a polishing speed of at least 1.0 mg/min but less than 1.5 mg/min was evaluated as ∘, that showing a polishing speed of at least 0.5 mg/min but less than 1.0 mg/min was evaluated as ▼, and that showing a polishing speed of less than 0.5 mg/min was evaluated as x. The results are shown in the column of "Polishing speed" in Tables 1 and 2.

Calculation Formula

Polishing speed [mg/min]=(Weight of wafer before edge polishing [mg]−Weight of wafer after edge polishing [mg])/Polishing time [min]

TABLE 1

| | Object to be polished | Colloidal silica | | Alkaline compound | | Water-soluble polymer | | Stain | Polishing speed |
|---|---|---|---|---|---|---|---|---|---|
| Ex. 1 | Bare | A | 5.8 wt % | TMAH | 1.5 wt % | HEC*1 | 0.008 wt % | ∘∘ | ∘∘ |
| Ex. 2 | Bare | A | 5.8 wt % | TMAH | 1.5 wt % | HEC*2 | 0.0005 wt % | ∘ | ∘∘ |
| Ex. 3 | Bare | A | 5.8 wt % | TMAH | 1.5 wt % | HEC*2 | 0.008 wt % | ∘∘ | ∘∘ |
| Ex. 4 | Bare | A | 5.8 wt % | TMAN | 1.5 wt % | HEC*2 | 0.03 wt % | ∘∘ | ∘∘ |
| Ex. 5 | Bare | A | 5.8 wt % | TMAH | 1.5 wt % | HEC*2 | 0.008 wt % | ∘∘ | ∘∘ |
| Ex. 6 | Bare | B | 5.8 wt % | TMAH | 1.5 wt % | HEC*2 | 0.008 wt % | ∘∘ | ∘∘ |
| Ex. 7 | Bare | C | 5.8 wt % | TMAH | 1.5 wt % | HEC*2 | 0.008 wt % | ∘∘ | ∘∘ |
| Ex. 8 | Bare | D | 5.8 wt % | TMAH | 1.5 wt % | HEC*2 | 0.008 wt % | ∘∘ | ∘∘ |
| Ex. 9 | Bare | E | 5.8 wt % | TMAH | 1.5 wt % | HEC*2 | 0.008 wt % | ∘ | ∘∘ |
| Ex. 10 | Bare | F | 5.8 wt % | TMAH | 1.5 wt % | HEC*2 | 0.008 wt % | ∘ | ∘∘ |
| Ex. 11 | Bare | G | 5.8 wt % | TMAH | 1.5 wt % | HEC*2 | 0.008 wt % | ∘ | ∘ |
| Ex. 12 | Bare | A | 5.8 wt % | PHA | 0.25 wt % | HEC*2 | 0.008 wt % | ∘∘ | ∘ |
| Ex. 13 | Bare | A | 5.8 wt % | PIZ | 0.25 wt % | HEC*2 | 0.008 wt % | ∘∘ | ∘∘ |
| Ex. 14 | Bare | A | 5.8 wt % | PCA | 0.25 wt % | HEC*2 | 0.008 wt % | ∘∘ | ∘ |
| Ex. 15 | Bare | A | 5.8 wt % | TMAH | 1.5 wt % | PVA | 0.008 wt % | ∘∘ | ∘∘ |
| Ex. 16 | Bare | A | 5.8 wt % | TMAH | 1.5 wt % | PEG | 0.008 wt % | ∘∘ | ∘∘ |
| Ex. 17 | Bare | A | 5.8 wt % | TMAH | 1.5 wt % | PEO | 0.008 wt % | ∘∘ | ∘∘ |
| Ex. 18 | Bare | A | 2.9 wt % | TMAH | 1.5 wt % | HEC*2 | 0.008 wt % | ∘∘ | ∘∘ |
| | | C | 2.9 wt % | | | | | | |
| Ex. 19 | Bare | A | 5.8 wt % | TMAH | 0.75 wt % | HEC*2 | 0.008 wt % | ∘∘ | ∘∘ |
| | | | | PIZ | 0.125 wt % | | | | |
| Ex. 20 | Bare | A | 5.8 wt % | PHA | 0.125 wt % | HEC*2 | 0.008 wt % | ∘∘ | ∘ |
| | | | | PCA | 0.125 wt % | | | | |

TABLE 1-continued

|  | Object to be polished | Colloidal silica | | Alkaline compound | | Water-soluble polymer | | Stain | Polishing speed |
|---|---|---|---|---|---|---|---|---|---|
| Ex. 21 | Bare | A | 5.8 wt % | TMAH | 1.5 wt % | HEC*2 PVA | 0.008 wt % 0.008 wt % | ○○ | ○○ |
| Ex. 22 | Bare | A | 5.8 wt % | TMAH | 1.5 wt % | HEC*2 PEG | 0.008 wt % 0.008 wt % | ○○ | ○○ |
| Ex. 23 | Bare | A | 5.8 wt % | TMAH | 1.5 wt % | HEC*2 PEO | 0.008 wt % 0.008 wt % | ○○ | ○○ |
| Ex. 24 | SiO$_2$ | A | 5.8 wt % | TMAH | 1.5 wt % | HEC*2 | 0.008 wt % | ○○ | ○ |
| Ex. 25 | SiO$_2$ | A | 5.8 wt % | PHA | 0.25 wt % | HEC*2 | 0.008 wt % | ○○ | ○○ |
| Ex. 26 | SiO$_2$ | B | 5.8 wt % | PHA | 0.25 wt % | HEC*2 | 0.008 wt % | ○○ | ○○ |
| Ex. 27 | SiO$_2$ | C | 5.8 wt % | PHA | 0.25 wt % | HEC*2 | 0.008 wt % | ○○ | ○○ |
| Ex. 28 | SiO$_2$ | D | 5.8 wt % | PHA | 0.25 wt % | HEC*2 | 0.008 wt % | ○○ | ○○ |
| Ex. 29 | SiO$_2$ | E | 5.8 wt % | PHA | 0.25 wt % | HEC*2 | 0.008 wt % | ○ | ○○ |
| Ex. 30 | SiO$_2$ | F | 5.8 wt % | PHA | 0.25 wt % | HEC*2 | 0.008 wt % | ○ | ○○ |
| Ex. 31 | SiO$_2$ | G | 5.8 wt % | PHA | 0.25 wt % | HEC*2 | 0.008 wt % | ○ | ○ |
| Ex. 32 | SiO$_2$ | A | 5.8 wt % | PIZ | 0.25 wt % | HEC*2 | 0.008 wt % | ○○ | ○ |
| Ex. 33 | SiO$_2$ | A | 5.8 wt % | PCA | 0.25 wt % | HEC*2 | 0.008 wt % | ○○ | ○○ |
| Ex. 34 | SiO$_2$ | A | 5.8 wt % | PIZ | 0.25 wt % | PEG | 0.008 wt % | ○○ | ○ |
| Ex. 35 | SiO$_2$ | A | 5.8 wt % | PCA | 0.25 wt % | PEO | 0.008 wt % | ○○ | ○○ |

TABLE 2

|  | Object to be polished | Colloidal silica | | Alkaline compound | | Water-soluble polymer | | Stain | Polishing speed |
|---|---|---|---|---|---|---|---|---|---|
| C. Ex. 1 | Bare | A | 5.8 wt % | TMAH | 1.5 wt % | — | — | ▲ | ○○ |
| C. Ex. 2 | Bare | H | 5.8 wt % | TMAH | 1.5 wt % | — | — | x | ▲ |
| C. Ex. 3 | Bare | H | 5.8 wt % | TMAH | 1.5 wt % | HEC*2 | 0.008 wt % | ▲ | ▲ |
| C. Ex. 4 | Bare | I | 5.8 wt % | TMAH | 1.5 wt % | HEC*2 | 0.008 wt % | ▲ | ▲ |
| C. Ex. 5 | Bare | J | 5.8 wt % | TMAH | 1.5 wt % | HEC*2 | 0.008 wt % | x | x |
| C. Ex. 6 | Bare | K | 5.8 wt % | TMAH | 1.5 wt % | HEC*2 | 0.008 wt % | ▲ | ▲ |
| C. Ex. 7 | Bare | L | 5.8 wt % | TMAH | 1.5 wt % | HEC*2 | 0.008 wt % | ▲ | ▲ |
| C. Ex. 8 | Bare | H | 5.8 wt % | TMAH | 1.5 wt % | PVA | 0.008 wt % | ▲ | ▲ |
| C. Ex. 9 | Bare | H | 5.8 wt % | TMAH | 1.5 wt % | PEG | 0.008 wt % | ▲ | ▲ |
| C. Ex. 10 | Bare | H | 5.8 wt % | TMAH | 1.5 wt % | PEO | 0.008 wt % | ▲ | ▲ |
| C. Ex. 11 | Bare | H | 5.8 wt % | TMAH | 1.5 wt % | G | 0.016 wt % | x | ▲ |
| C. Ex. 12 | Bare | H | 5.8 wt % | TMAH | 1.5 wt % | EG | 0.016 wt % | x | ▲ |
| C. Ex. 13 | Bare | H | 5.8 wt % | TMAH | 1.5 wt % | SPA | 0.016 wt % | x | ▲ |
| C. Ex. 14 | SiO$_2$ | A | 5.8 wt % | PHA | 0.25 wt % | — | — | ▲ | ○○ |
| C. Ex. 15 | SiO$_2$ | H | 5.8 wt % | PHA | 0.25 wt % | — | — | x | ▲ |
| C. Ex. 16 | SiO$_2$ | H | 5.8 wt % | PHA | 0.25 wt % | HEC*2 | 0.008 wt % | ▲ | ▲ |
| C. Ex. 17 | SiO$_2$ | I | 5.8 wt % | PHA | 0.25 wt % | HEC*2 | 0.008 wt % | ▲ | ▲ |
| C. Ex. 18 | SiO$_2$ | J | 5.8 wt % | PHA | 0.25 wt % | HEC*2 | 0.008 wt % | x | x |
| C. Ex. 19 | SiO$_2$ | K | 5.8 wt % | PHA | 0.25 wt % | HEC*2 | 0.008 wt % | ▲ | ▲ |
| C. Ex. 20 | SiO$_2$ | L | 5.8 wt % | PHA | 0.25 wt % | HEC*2 | 0.008 wt % | ▲ | ▲ |

TABLE 3

| Colloidal Silica | A | B | C | D | E | F | G | H | I | J | K | L |
|---|---|---|---|---|---|---|---|---|---|---|---|---|
| $D_{SA}$ (μm) | 80 | 80 | 550 | 91 | 67 | 60 | 55 | 55 | 60 | 25 | 31 | 35 |
| $D_{95}/D_5$ | 3.3 | 2.8 | 3.6 | 3.2 | 3.1 | 3.2 | 3.7 | 4.1 | 5.2 | 4.4 | 2.7 | 3.9 |
| $D_{95}/D_5/D_{SA}$ (×10$^{-3}$) | 41 | 35 | 6 | 36 | 46 | 53 | 67 | 75 | 87 | 176 | 86 | 111 |

As shown in Tables 1 and 2, there were recognized entirely no or few stains on the surface of the wafer edge-polished by the polishing compositions of Examples 1 to 35. This means that there are entirely no or few abrasives, remaining in the form of gel on the wafer. From this result, it is clear that the polishing compositions of Examples 1 to 35 significantly reduce the amount of abrasives remaining on the wafer.

The present examples and embodiments are to be considered as illustrative and not restrictive and the invention is not to be limited to the details given herein, but may be modified within the scope and equivalence of the appended claims.

The invention claimed is:

1. A polishing composition used in polishing a wafer edge, the polishing composition comprising:
silicon dioxide, wherein an average primary particle diameter $D_{SA}$ of the silicon dioxide, which is obtained from a specific surface area of the silicon dioxide measured by a BET method, is at least 40 nm, and wherein a ratio $D_{95}/D_5$ of the silicon dioxide, which is obtained by dividing a 95th percentile diameter $D_{95}/D_5$ of the silicon dioxide in terms of volume by a 5th percentile diameter $D_5$, of the silicon dioxide in terms of volume, is no more than 3.8,
an alkaline compound,
a water-soluble polymer, and
water.

2. The polishing composition according to claim 1, wherein the avenge primary particle diameter $D_{SA}$ is at least 60 nm.

3. The polishing composition according to claim 2, wherein the average primary particle diameter $DS_A$ is at least 70 nm.

4. The polishing composition according to claim 1, wherein the ratio $D_{95}/D_5$ is no more than 3.6.

5. The polishing composition according to claim 4, wherein the ratio $D_{95}/D_5$ is no more than 3.4.

6. The polishing composition according to claim 1, wherein the silicon dioxide is at least one silica selected from colloidal silica, fumed silica, and precipitated silica.

7. The polishing composition according to claim 6, wherein the silicon dioxide is colloidal silica.

8. The polishing composition according to claim 1, wherein the water-soluble polymer is at least one polymer selected from hydroxyethyl cellulose, polyvinyl alcohol, polyethylene oxide, and polyethylene glycol.

9. The polishing composition according to claim 8, wherein the water-soluble polymer is hydroxyethyl cellulose.

10. The polishing composition according to claim 1, wherein content of the water-soluble polymer in the polishing composition is from 0.0001 to 0.5 wt %.

11. The polishing composition according to claim 1, wherein the alkaline compound is at least one alkaline compound selected from potassium hydroxide, sodium hydroxide, potassium hydrogencarbonate, potassium carbonate, sodium hydrogencarbonate, sodium carbonate, tetramethylammonium hydroxide, ammonium hydrogencarbonate, ammonium carbonate, anhydrous piperazine, and piperazine hexahydrate.

12. A polishing composition used in polishing a wafer edge, the polishing composition comprising:
silicon dioxide, wherein an average primary particle diameter $D_{SA}$ of the silicon dioxide, which is obtained from a specific surface area of the silicon dioxide measured by a BET method, is at least 40 nm, and wherein a value $D_{95}/D_5/D_{SA}$ of the silicon dioxide, which is obtained by dividing a 95th percentile diameter $D_{95}$ of the silicon dioxide in terms of volume by a 5th percentile diameter $D_5$ of the silicon dioxide in terms of volume and further dividing the obtained ratio $D_{95}/D_5$ by the average primary particle diameter $D_{SA}$, is no more than 0.07.
an alkaline compound,
a water-soluble polymer, and
water.

13. The polishing composition according to claim 12, wherein the value $D_{95}/D_5/D_{SA}$ is no more than 0.06.

14. The polishing composition according to claim 13, wherein the value $D_{95}/D_5/D_{SA}$ is no more than 0.045.

15. The polishing composition according to claim 12, wherein the ratio $D_{95}/D_5$ is no more than 3.8.

16. The polishing composition according to claim 15, wherein the ratio $D_{95}/D_5$ is no more than 3.6.

17. The polishing composition according to claim 16, wherein the ratio $D_{95}/D_5$ is no more than 3.4.

18. A method of polishing a wafer, the method comprising:
preparing a polishing composition, wherein the polishing composition includes:
silicon dioxide, wherein an average primary particle diameter $D_{SA}$ of the silicon dioxide, which is obtained from a specific surface area of the silicon dioxide measured by a BET method, is at least 40 nm, and wherein a ratio $D_{95}/D_5$ of the silicon dioxide, which is obtained by dividing a 95th percentile diameter $D_{95}$ of the silicon dioxide in terms of volume by a 5th percentile diameter $D_5$, of the silicon dioxide in terms of volume, is no more than 3.8;
an alkaline compound;
a water-soluble polymer; and
water; and
polishing a edge of the wafer using the polishing composition.

19. A method of polishing a wafer, the method comprising:
preparing a polishing composition, wherein the polishing composition includes:
silicon dioxide, wherein an average primary particle diameter $D_{SA}$ of the silicon dioxide, which is obtained from a specific surface area of the silicon dioxide measured by a BET method, is at least 40 nm, and wherein a value $D_{95}/D_5/D_{SA}$ of the silicon dioxide, which is obtained by dividing a 95th percentile diameter $D_{95}$ of the silicon dioxide in terms of volume by a 5th percentile diameter $D_5$ of the silicon dioxide in terms of volume and further dividing the obtained ratio $D_{95}/D_5$ by the average primary particle diameter $D_{SA}$ is no more than 0.07;
an alkaline compound;
water-soluble polymer; and
water; and
polishing a edge of the wafer using the polishing composition.

20. A method of polishing a wafer the method comprising:
preparing a polishing composition, wherein the polishing composition includes:
silicon dioxide, wherein an average primary particle diameter $D_{SA}$ of the silicon dioxide, which is obtained from a specific surface area of the silicon dioxide measured by a BET method, is at least 40 nm, wherein a ratio $D_{95}/D_5$ of the silicon dioxide, which is obtained by dividing a 95th percentile diameter $D_{95}$ of the silicon dioxide in terms of volume, by a 5th percentile diameter $D_5$ of the silicon dioxide in terms of volume, is no more than 3.8, and wherein a value $D_{95}/D_5/D_{SA}$ of the silicon dioxide, which is obtained by dividing the ratio $D_{95}/D_5$ by the average primary particle diameter $D_{SA}$, is no more than 0.07;
an alkaline compound;
a water-soluble polymer; and
water; and
polishing a edge of the wafer using the polishing composition.

* * * * *